(12) United States Patent
Hu et al.

(10) Patent No.: US 12,068,092 B2
(45) Date of Patent: Aug. 20, 2024

(54) STRUCTURE OF RESISTOR DEVICE AND SYSTEM FOR MEASURING RESISTANCE OF SAME

(71) Applicant: Cyntec Co., Ltd., Hsinchu (TW)

(72) Inventors: Chih Yu Hu, Hsinchu (TW); Wen Hao Wu, Hsinchu (TW); Chun Cheng Yao, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 0 days.

(21) Appl. No.: 17/716,504

(22) Filed: Apr. 8, 2022

(65) Prior Publication Data

US 2023/0326633 A1 Oct. 12, 2023

(51) Int. Cl.
| | |
|---|---|
| *H01C 1/148* | (2006.01) |
| *G01R 1/20* | (2006.01) |
| *G01R 19/00* | (2006.01) |
| *H01C 13/02* | (2006.01) |

(52) U.S. Cl.
CPC ............. *H01C 1/148* (2013.01); *G01R 1/203* (2013.01); *G01R 19/00* (2013.01); *H01C 13/02* (2013.01)

(58) Field of Classification Search
CPC ......... H01C 1/148; H01C 13/02; G01R 19/00
See application file for complete search history.

(56) References Cited

U.S. PATENT DOCUMENTS

| | | | | |
|---|---|---|---|---|
| 5,214,407 A | * | 5/1993 | McKim, Jr. ............ | H01C 17/24 338/195 |
| 8,031,043 B2 | * | 10/2011 | Schultz ................... | H01C 1/014 338/49 |
| 8,598,976 B2 | * | 12/2013 | Hetzler ................... | H01C 17/28 338/322 |
| 8,884,733 B2 | * | 11/2014 | Hetzler ................... | H01C 7/06 338/195 |
| 9,305,687 B2 | * | 4/2016 | Cheng .................... | G01R 1/203 |
| 10,163,553 B2 | * | 12/2018 | Kameko ................ | H01C 17/28 |

(Continued)

FOREIGN PATENT DOCUMENTS

| | | |
|---|---|---|
| CN | 211086569 U | 7/2020 |
| JP | H06283571 A * | 10/1994 |

(Continued)

OTHER PUBLICATIONS

JP3989631, machine translation. (Year: 2007).*

(Continued)

*Primary Examiner* — Kyung S Lee
(74) *Attorney, Agent, or Firm* — KIRTON McCONKIE; Evan R. Wittr

(57) ABSTRACT

A resistor structure includes a resistor body; and a first electrode structure disposed at and being in electric contact with a first end of the resistor body, and a second electrode structure disposed at and being in electric contact with a second end opposite to the first end of the resistor body. Each of the first electrode structure and the second electrode structure has at least one conductive protrusion. The at least one conductive protrusion of the first electrode structure and the at least one conductive protrusion of the second electrode structure both serve as voltage-sensing terminals for electric connection to an external voltage measurement device, or both serve as current-sensing terminals for electric connection to a current measurement device.

20 Claims, 9 Drawing Sheets

(56) References Cited

U.S. PATENT DOCUMENTS

2006/0273423 A1* 12/2006 Tsukada .............. H01C 17/006
                                                              257/516
2014/0097933 A1    4/2014 Yoshioka et al.

FOREIGN PATENT DOCUMENTS

| JP | H09306952 A  | * | 11/1997 |
| JP | 3989631 B2   | * | 10/2007 |
| KR | 20140134517 A | * | 11/2014 |

OTHER PUBLICATIONS

JPH06283571, machine translation. (Year: 1994).*
JPH09306952, machine translation. (Year: 1997).*
KR1020140134517, machine translation. (Year: 2014).*

* cited by examiner

STRUCTURE OF RESISTOR DEVICE AND SYSTEM FOR MEASURING RESISTANCE OF SAME

FIELD OF THE INVENTION

The present invention relates to a system for measuring a resistance of a resistor device, and more particularly to a four-terminal measurement system for measuring a resistance of a resistor device. The present invention also relates to a resistor structure adapted to be resistance-measured by a four-terminal measurement system.

BACKGROUND OF THE INVENTION

In general, the resistance of a resistor can be measured by measuring the voltage across the resistor and the current flowing through the resistor and operating the voltage and current values according to Ohm's law. For example, in a conventional two-wire measurement system shown in FIG. 1, a resistor R is electrically connected to an external power supply P and an ammeter A in series, and electrically connected to a voltmeter V in parallel. The voltage across the resistor R is detected at two points B and measured by the voltmeter V; and the current flowing through the resistor R is also detected at the two points B and measured by the ammeter A. Then the measured voltage and current values are operated to determine the resistance value of the resistor R. It is to be noted that practically, wires C of the circuit have a certain degree of impedance, so the measured voltage and current values cannot actually equal to the real voltage value across the resistor and the real current value flowing through the resistor R. The impedance of the wire C, taking a copper wire with a length of 1 m as an example, is about 0.1Ω. Therefore, when the resistance of the resistor R of interest is much larger than the impedance of the wire C, the impedance of the wire C can be ignored. However, if the resistor R of interest is of a low resistance, the influence of the impedance of the wire C on the measurement of the resistance of the resistor R would become significant. Generally, the smaller the resistance value of the resistor R, the more obvious the influence caused by the impedance of the wire C. In other words, the conventional two-wire measurement method is less precise when measuring a resistor of a lower resistance.

SUMMARY OF THE INVENTION

Therefore, the present invention provides a system capable of precisely measuring a resistance of a resistor device.

The present invention also provides a resistor structure adapted to be resistance-measured by the system.

In an aspect of the present invention, a resistor structure includes a resistor body; and a first electrode structure disposed at and being in electric contact with a first end of the resistor body, and a second electrode structure disposed at and being in electric contact with a second end opposite to the first end of the resistor body. Each of the first electrode structure and the second electrode structure has at least one conductive protrusion. The at least one conductive protrusion of the first electrode structure and the at least one conductive protrusion of the second electrode structure both serve as voltage-sensing terminals for electric connection to an external voltage measurement device, or both serve as current-sensing terminals for electric connection to a current measurement device.

In another aspect of the present invention, a resistor structure includes a substrate; a resistance layer disposed on the substrate; a protective layer overlying the resistance layer; and a first electrode structure disposed at and being in electric contact with a first end of the resistance layer, and a second electrode structure disposed at and being in electric contact with a second end opposite to the first end of the resistance layer. Each of the first electrode structure and the second electrode structure has at least one conductive protrusion, and each of the at least one conductive protrusion of the first electrode structure and the at least one conductive protrusion of the second electrode structure has a top surface extending over that of the protective layer.

In a further aspect of the present invention, a resistor device includes a resistor body, a first electrode structure in electric contact with a first end of the resistor body, and a second electrode structure in electric contact with a second end opposite to the first end of the resistor body, wherein each of the first electrode structure and the second electrode structure has a first set of conductive protrusion and a second set of conductive protrusion. A system for measuring a resistance of the resistor device includes a fixture for measurement, a power device, a voltage measurement device, a current measurement device, and a resistance-determining device. The fixture for measurement includes four pads for electric contact with the first set of conductive protrusion and the second set of conductive protrusion of the first electrode structure and the first set of conductive protrusion and the second set of conductive protrusion of the second electrode structure, respectively, wherein each of the four pads has an area larger than an area of the first or second set of conductive protrusion in electric contact therewith. The power device is configured to provide a power. The voltage measurement device is electrically connected to the power device, the first set of conductive protrusion of the first electrode structure, and the first set of conductive protrusion of the second electrode structure, and configured to measure a voltage value between the first set of conductive protrusions of the first electrode structure and the second electrode structure under provision of the power. The current measurement device is electrically connected to the power device, the second set of conductive protrusion of the first electrode structure, and the second set of conductive protrusion of the second electrode structure, and configured to measure a current value passing through the second set of conductive protrusions of the first electrode structure and the second electrode structure under provision of the power. The resistance-determining device is electrically connected to the voltage measurement device and the current measurement device, and configured to obtain the resistance of the resistor device based on the voltage value and the current value.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
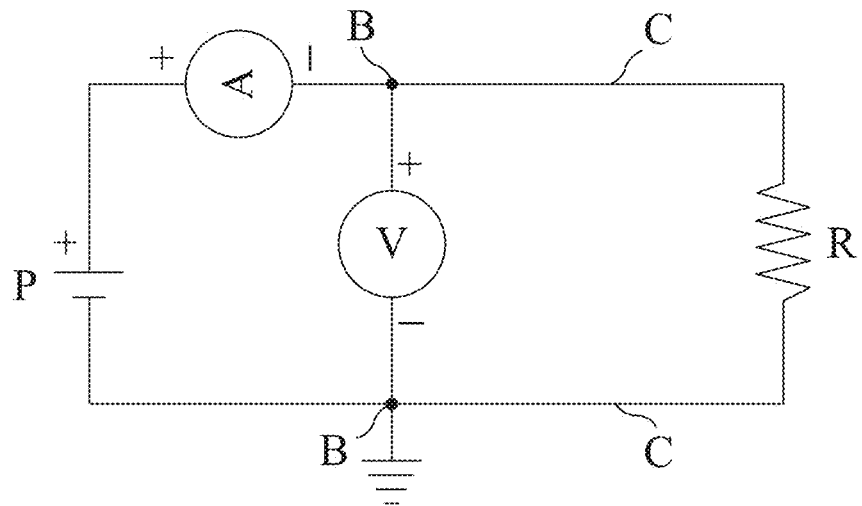
FIG. 1 is a circuit diagram illustrating a two-wire measurement system for measuring the resistance of a resistor.
Figure 2A:
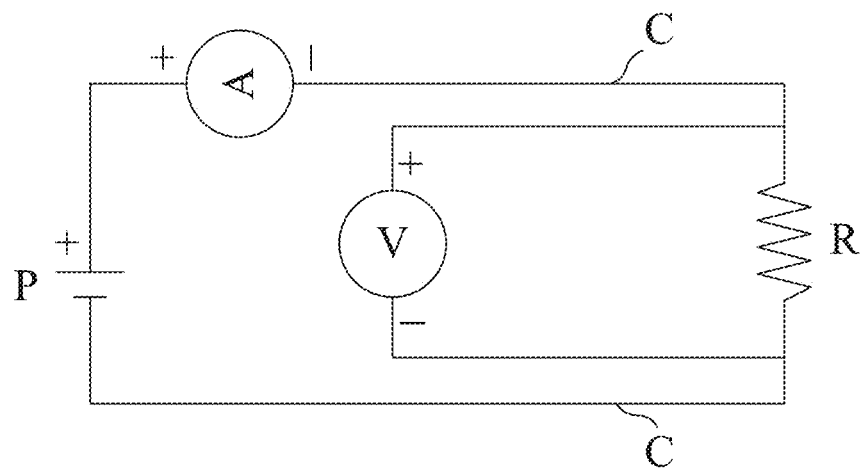
FIG. 2A is a circuit diagram illustrating a four-terminal measurement system for measuring the resistance of a resistor.

To improve the precision of resistance measurement of a low-resistance resistor, a four-terminal measurement, which is also referred to as a four-wire sensing, four-point probes or Kelvin sensing system, is developed. Please refer to FIG. 2A, in which a circuit diagram of the four-terminal measurement system is illustrated. In the four-terminal measurement system, a resistor R is electrically connected to an external power supply P and an ammeter A in series and electrically connected to a voltmeter V in parallel, and the resistance of the resistor R is calculated according to Ohm's law. In spite the resistance-measuring principle of the four-terminal measurement system is like that of the two-wire measurement system shown in FIG. 1, the four-terminal measurement system differs from the two-wire measurement system in using a pair of current electrodes to perform current measurement and using another pair of voltage electrodes to perform voltage measurement. By separating the voltage electrodes from the current electrodes, the voltmeter V can accurately measure the voltage across the resistor R with minimized influence of the wire C.

Figure 2B:
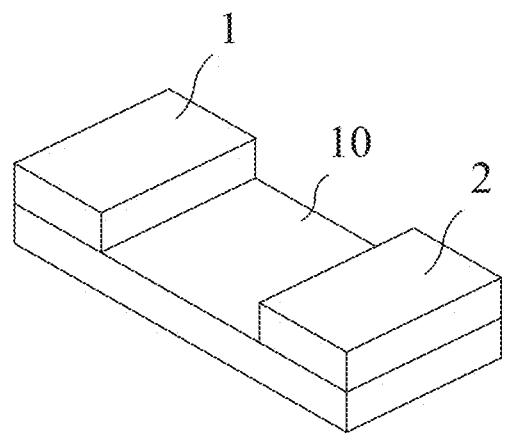
FIG. 2B is a schematic diagram of the structure of a conventional chip resistor.

For example, the four-terminal measurement system can be used for measuring resistance of a chip resistor. Due to the features of small size, high power, and low cost, a chip resistor can be used in a variety of electronic products. For example, chip resistors are commonly used in 3C (computer, communication, and consumer) electronics or automotive electronics, and suitably function for voltage drop and current limiting. When in use, the bottom side of the chip resistor is usually soldered to a circuit board, and on the top side, a resistance layer and a protective layer covering the resistance layer are formed through printing and drying sintering. A basic structure of a conventional chip resistor is shown in FIG. 2B, wherein the chip resistor includes a resistor body 10 and electrode structures 1 and 2 disposed at opposite ends of the resistor body 10. For measuring the resistance of the chip resistor R shown in FIG. 2B with the four-terminal measurement system shown in FIG. 2A, four probes V+, V−, I+ and I− are electrically connected to the electrode structures 1 and 2. The voltage value measured via the probes V+ and V− and the current value measured via the probes I+ and I− are then operated to obtain the resistance value of the chip resistor R. Further referring to FIG. 3A, two points on the first and second electrode structures 11 and 12 of the chip resistor R, where the probes are in contact with, are measuring points BV1 and BV2 for voltage measurement, and another two points on the first and second electrode structures 11 and 12 of the chip resistor R, where the probes are in contact with, are measuring points BI1 and BI2 for current measurement.

Figure 3A:
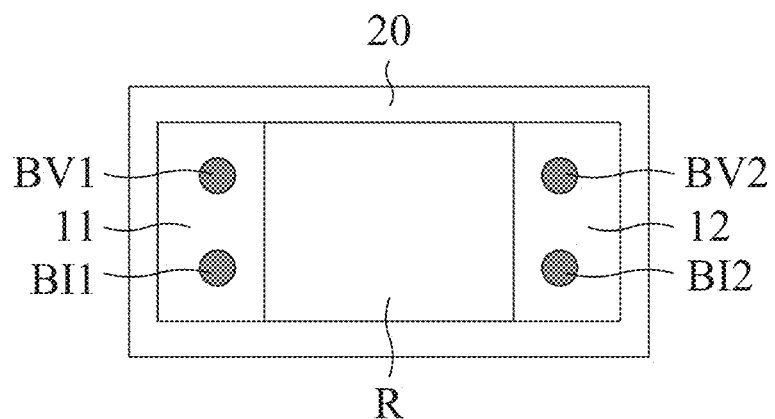
FIG. 3A is a scheme showing ideal positions of measuring points for measuring resistance of the chip resistor of FIG. 2B with the fixture of FIG. 2C.

Unfortunately, in the assessment of GRR (Gage R&R) of the chip-scale resistor, the repeatability and reproducibility of the resistance measurement by way of the related art means are not satisfactory. For example, 1% GRR is up to 18.44, and 0.1% GRR is greater than 150. It is found that the adversely high GRR is owing to shifts of the measuring points BV1, BV2, BI1 and BI2. Possible shift situations from the ideal positions shown in FIG. 3A are exemplified in FIGS. 3B, 3C and 3D. In the case FIG. 3B, the chip resistor R is disposed in the fixture 20 with a little deviation to the left side, so the measuring points slightly shift rightwards, compared to the ideal ones shown in FIG. 3A. In the case FIG. 3C, the chip resistor R is disposed in the fixture 20 with a little deviation to the upper side, so the measuring points slightly shift downwards, compared to the ideal ones shown in FIG. 3A. Likewise, in the case FIG. 3D, the chip resistor R is disposed in the fixture 20 with a little deviation to the upper and left side, so the measuring points slightly shift downwards and rightwards, compared to the ideal ones shown in FIG. 3A. TABLE 1 exemplifies simulation results of resistance measurement in the above-described four cases, showing influences of the shifts on the resistance measurement. In the simulation, a clearance between the measuring points BV1 and BV2, as well as between the measuring points BI1 and BI2, is 0.44 mm, and a clearance between the measuring points BV1 and BI1, as well as between the measuring points BV2 and BI2, is 0.16 mm. The measurement points shown in each of the cases FIGS. 3B, 3C and 3D, although having the same clearances as mentioned above, has a downward shift of 4.05 μm and/or a rightward shift of 4.40 μm. The simulation results show certain levels of deviation of resistance, which cannot be ignored in most applications.

TABLE 1

Figure 3B:
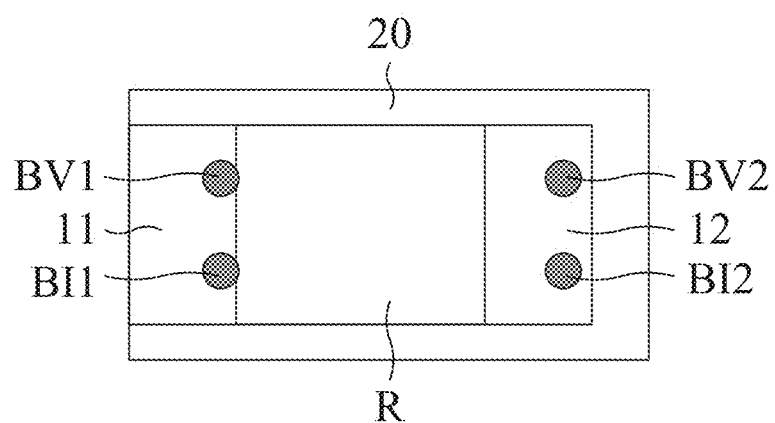
FIG. 3B is a scheme showing a deflective situation of the measuring points when measuring resistance of the chip resistor of FIG. 2B with the fixture of FIG. 2A.
Figure 3C:
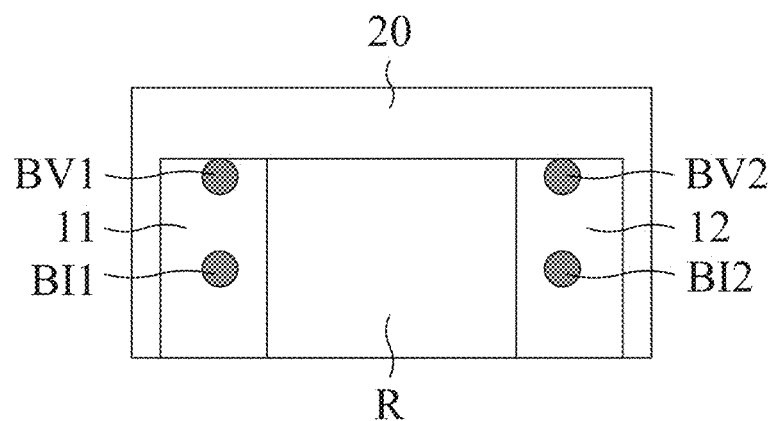
FIG. 3C is a scheme showing another deflective situation of the measuring points when measuring resistance of the chip resistor of FIG. 2B with the fixture of FIG. 2A.
Figure 3D:
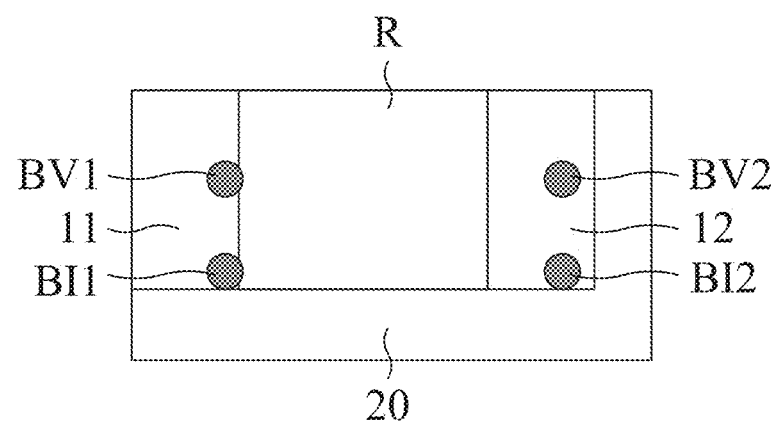
FIG. 3D is a scheme showing a further deflective situation of the measuring points when measuring resistance of the chip resistor of FIG. 2B with the fixture of FIG. 2A.

| Positions of measuring points | Resistance Ω | Deviation % |
|---|---|---|
| Case FIG. 3A | 19.386 | — |
| Case FIG. 3B | 19.424 | 0.19 |
| Case FIG. 3C | 19.411 | 0.13 |
| Case FIG. 3D | 19.424 | 0.19 |

Therefore, to further improve the precision of resistance measurement of a low-resistance resistor with the four-terminal measurement system, the resistor structure is modified according to the present invention, and meanwhile, a fixture adapted to used with the resistor structure according to the present invention is provided.

Figure 4A:
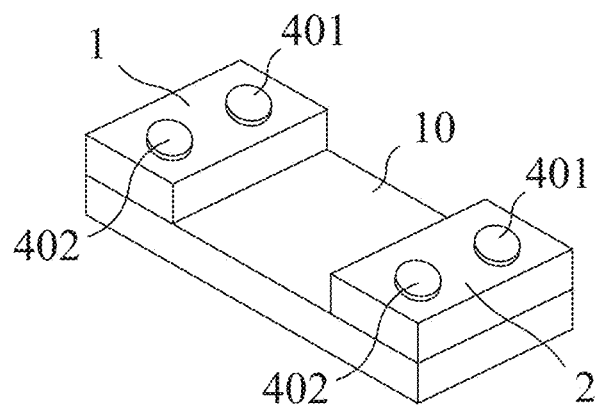
FIG. 4A is a schematic diagram illustrating conductive protrusions formed on electrodes of a resistor device for voltage and current measurement according to the present invention.

Please refer to FIG. 4A. A resistor device according to an embodiment of the present invention principally includes a resistor body 10, a first electrode structure 1 in electric contact with a first end of the resistor body 10, and a second electrode structure 2 in electric contact with a second end opposite to the first end of the resistor body 10. Each of the first electrode structure 1 and the second electrode structure 2 includes a first conductive protrusion 401 and a second conductive protrusion 402. For measuring the resistance of the chip resistor R shown in FIG. 4A with the four-terminal measurement system shown in FIG. 2A, the chip resistor R is positioned into a fixture 40, which includes four pads V+, V−, I+ and I−, as shown in FIG. 4D. The conductive protrusions 401 and 402 of the electrode structures 1 and 2 are in electric contact with the four pads V+, V−, I+ and I− of the fixture 40, respectively, wherein the conductive protrusions 401 serve as the measuring points BV1 and BV2 for voltage measurement, and the conductive protrusions 402 serve as the measuring points BI1 and BI2 for current measurement. Since the conductive protrusions 401 and 402 are fixed parts of the resistor structure, the clearances between every two of the measuring points are constant, and meanwhile, the positions of the measuring points will not change with the disposition situation of the resistor device R in the fixture 40. Therefore, voltage and current values can be precisely measured at the measuring points for calculating the resistance of the resistor device. A satisfactory GRR can thus be obtained.

Figure 4B:
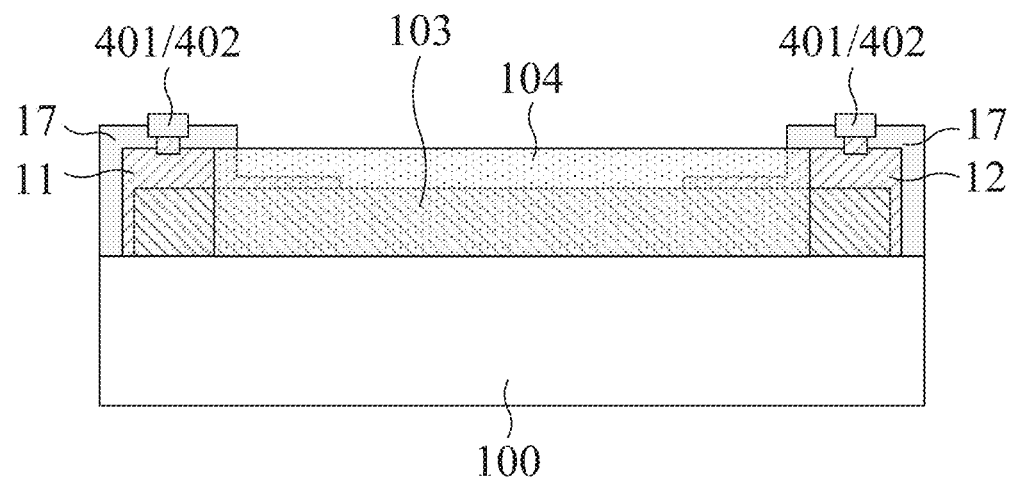
FIG. 4B is a schematic diagram illustrating a resistor structure according to an embodiment of the present invention.

FIG. 4B schematically illustrates a resistor structure according to another embodiment of the present invention. The chip resistor includes a resistor body, a first electrode structure, and a second electrode structure. The resistor body includes a substrate 100, a resistance layer 103 disposed on the substrate 100, and a protective layer 104 overlying the resistance layer 103. The first electrode structure includes a top electrode 11 formed on and being in electric contact with the resistance layer 103 at a first end 101 of the resistor body, and a plating layer 17 formed on the top electrode 11. Likewise, the second electrode structure includes a top electrode 12 formed on and being in electric contact with the resistance layer 103 at a second end 102 of the resistor body, and also a plating layer 17 formed on the top electrode 12. The substrate, for example, is a laminated substrate. The resistance layer 103, for example, is made of a metal alloy. The top electrodes 11 and 12, for example, are copper terminals. The plating layer 17, for example, is Cu/Ni/Sn layer. The resulting chip resistor has dimensions of about 0.60 mm in length, about 0.31 mm in width and about 0.21 mm in thickness. According to the present invention, the first electrode structure further includes conductive protrusions 401 and 402 on the top electrode 11, and likewise, the second electrode structure further includes conductive protrusions 401 and 402 on the top electrode 12. The conductive protrusions 401 and 402 may be formed of the same material as the top electrodes 11 and 12. In an exemplified process, the top electrodes 11 and 12 is formed on the resistance layer 103 first, and then the conductive protrusions 401 and 402 are formed on the top electrodes 11 and 12. Afterwards, the plating layer 17 are formed onto the top electrodes 11 and 12 and the conductive protrusions 401 and 402.

Figure 5A:
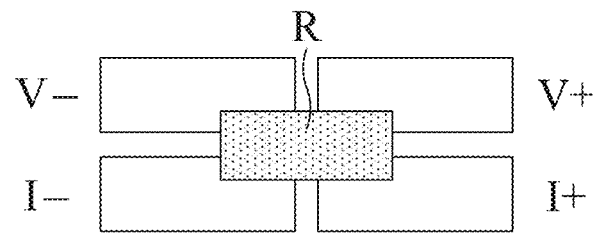
FIG. 5A is a top view schematically showing an ideal situation of a resistor structure disposed in a fixture for measuring the resistance of the resistor structure according to the present invention

When the chip resistor R is placed into the fixture 40 to be measured, possible shift situations from the ideal positions shown in FIG. 5A are exemplified in FIGS. 5B-5F. Simulations are made to evaluate influences of the shifts on the resistance measurement of the chip resistor R. TABLE 2 exemplifies simulation results of resistance measurement in the cases FIGS. 5A-5F.

TABLE 2

Figure 5B:
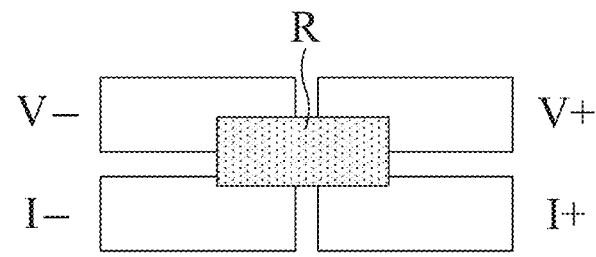
FIGS. 5B-5F are top views schematically showing possible deflective situations of a resistor structure disposed in a fixture for measuring the resistance of the resistor structure according to the present invention.
Figure 5C:
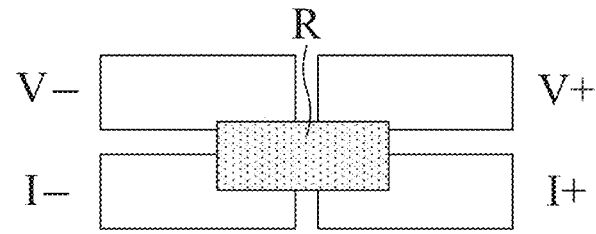
Figure 5D:
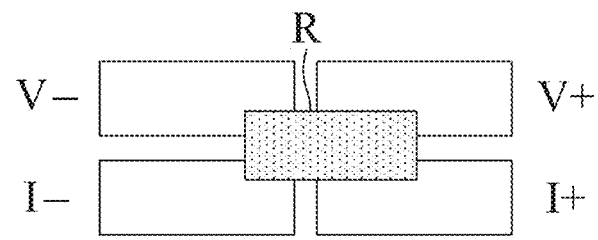
Figure 5E:
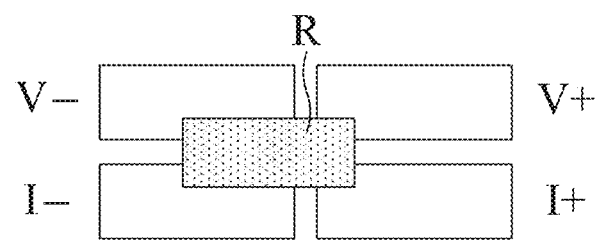
Figure 5F:
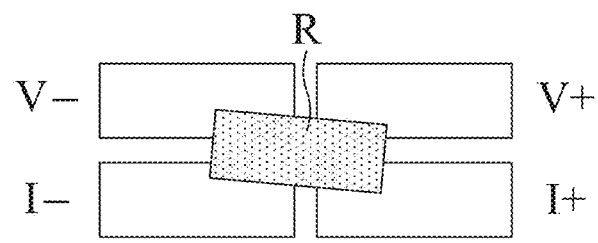

| Positions of measuring points | Resistance Ω | Deviation % |
|---|---|---|
| Case FIG. 5A No shift | 20.0117 | — |
| Case FIG. 5B 0.015 mm upward shift | 20.0116 | −0.0004892 |
| Case FIG. 5C 0.015 mm downward shift | 20.0117 | −0.0004869 |
| Case FIG. 5D 0.015 mm rightward shift | 20.0117 | +0.0000663 |
| Case FIG. 5E 0.015 mm leftward shift | 20.0117 | +0.0000662 |
| Case FIG. 5F 3 degrees rotation | 20.0119 | +0.0008045 |

It can be seen from the simulation that the resistance measurement according to the present invention is reliable.

Figure 4C:
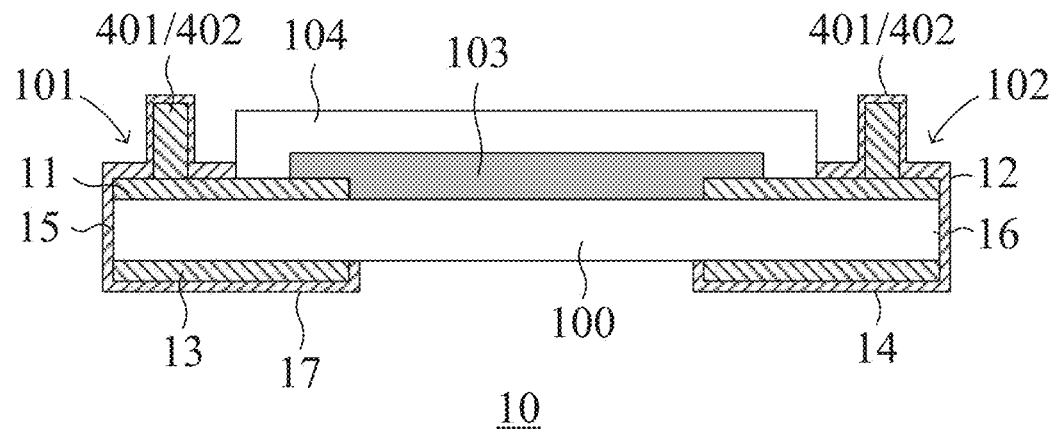
FIG. 4C is a schematic cross-sectional view of a resistor structure according to another embodiment of the present invention.
Figure 4D:
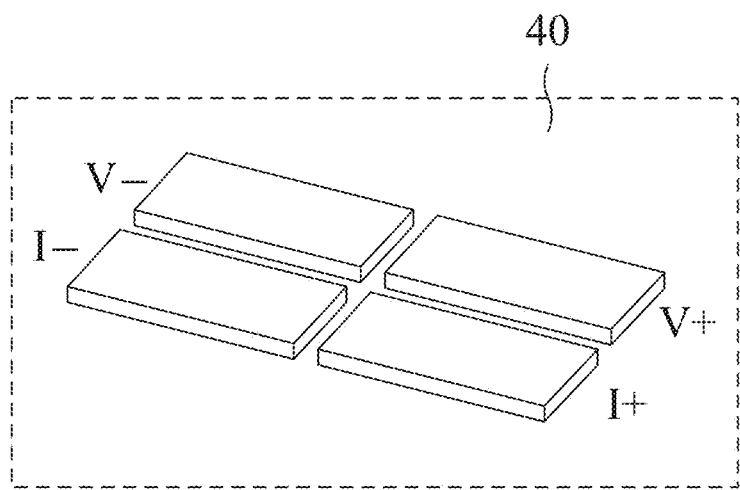
FIG. 4D is a schematic diagram illustrating a fixture included in a system for measuring resistance of a resistor device according to the present invention.

FIG. 4C schematically illustrates a resistor structure according to a further embodiment of the present invention. The chip resistor includes a resistor body 10 including a substrate 100, a resistance layer 103 and a protective layer 104, like those described above with reference to FIG. 4B; a first electrode structure including a top electrode 11, a plurality of conductive protrusions 401 and 402, a bottom electrode 13, an end face electrode 15 and a plating layer 17; and a second electrode structure including a top electrode 12, a plurality of conductive protrusions 401 and 402, a bottom electrode 14, an end face electrode 16 and a plating layer 17. The bottom electrode structures 13 and 14 are arranged on the bottom surface of the substrate 100, and the end face electrode structures 15 and 16 are electrically connect the top electrodes 11 and 12 to the bottom electrodes 13 and 14, respectively. In this embodiment of resistor structure, the protective layer 104 has a level higher than the top electrodes 11 and 12. For effective contact with the pads V+, V−, I+ and I− of the fixture 40, each of the conductive protrusions 401 and 402 should have a top surface extending over that of the protective layer 104. Furthermore, respective topmost points of the conductive protrusions 401 and 402 should be all coplanar. For example, each of the conductive protrusions 401 and 402 has a flat top surface, and all the flat top surfaces are coplanar.

Figure 6A:
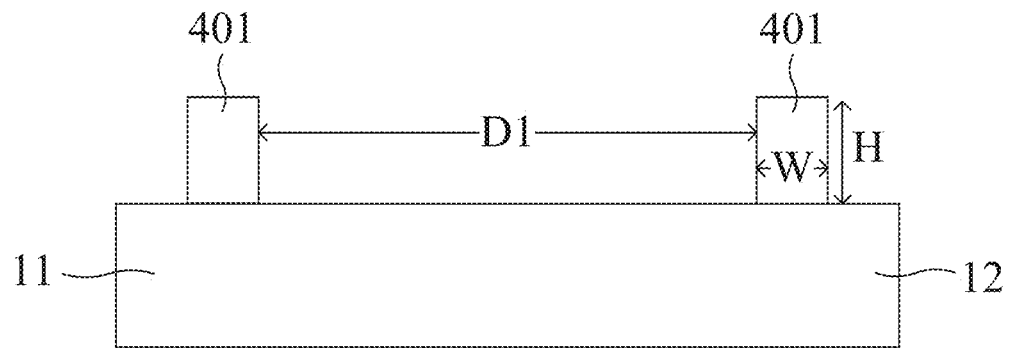
FIGS. 6A and 6B are schemes illustrating configuration and dimension of conductive protrusions of a resistor structure according to an embodiment of the present invention.
Figure 6B:
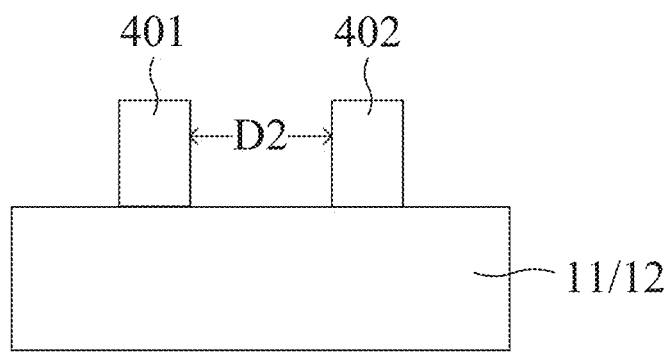

The conductive protrusions 401 and 402 described above may be of any suitable shape. For example, they may be cylindrical, as exemplified in FIGS. 6A and 6B, or of polygonal columns, or a combination thereof. For obtaining satisfactory GRR, at least one, or each, diameter W of the conductive protrusions 401 and 402 is ranged between 10 μm and 40 μm; and at least one, or each, thickness H of the conductive protrusions 401 and 402 is ranged between 10

μm and 50 μm. Furthermore, a clearance D1 between respective conductive protrusions 401 of the first electrode structure 11 and second electrode structure 12 is ranged between 450 μm and 570 μm, and a clearance D2 between the conductive protrusions 401 and 402 of each of the first electrode structure 11 and the second electrode structure 12 is not less than 100 μm.

It is to be noted that in the above embodiments, four conductive protrusions are formed for performing the four-terminal measurement. Alternatively, more than four conductive protrusions may be provided on the first and second electrode structures, or a set of conductive members may be used as one of the four conductive protrusions, depending on practical requirements, as long as the voltage and current values can be precisely measured for determining the resistance value of the resistor device.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A resistor structure, comprising:
   a resistor body; and
   a first electrode structure being a piece of conductive material disposed at and being in electric contact with a first end of the resistor body, and a second electrode structure being a piece of conductive material disposed at and being in electric contact with a second end opposite to the first end of the resistor body, the first electrode structure comprising first and second conductive protrusions having a clearance from each other, and the second electrode structure comprising third and fourth conductive protrusions having a clearance from each other;
   wherein one of the first and second conductive protrusions of the first electrode structure and one of the third and fourth conductive protrusions of the second electrode structure serve as voltage-sensing terminals for electric connection to an external voltage measurement device, or serve as current-sensing terminals for electric connection to an external current measurement device.

2. The resistor structure according to claim 1, wherein each of the first conductive protrusion and the third conductive protrusion serves as a voltage-sensing terminal for electric connection to an external voltage measurement device, and each of the second conductive protrusion and the fourth conductive protrusion serves as a current-sensing terminal for electric connection to an external current measurement device.

3. The resistor structure according to claim 1, wherein respective topmost points of the first, second, third and fourth conductive protrusions are all coplanar.

4. The resistor structure according to claim 1, wherein a clearance between the first conductive protrusion of the first electrode structure and the third conductive protrusion of the second electrode structure is ranged between 450 μm and 570 μm, and a clearance between the second conductive protrusion of the first electrode structure and the fourth conductive protrusion of the second electrode structure is ranged between 450 μm and 570 μm.

5. The resistor structure according to claim 1, wherein the clearance between the first and second conductive protrusions of the first electrode structure is not less than 100 μm, and the clearance between the third and fourth conductive protrusions of the second electrode structure is not less than 100 μm.

6. The resistor structure according to claim 1, wherein at least one diameter of the first, second, third, and fourth conductive protrusions is ranged between 10 μm and 40 μm.

7. The resistor structure according to claim 1, wherein at least one thickness of the first, second, third, and fourth conductive protrusions is ranged between 10 μm and 50 μm.

8. The resistor structure according to claim 1, wherein each of the first, second, third, and fourth conductive protrusions includes a flat top surface.

9. A resistor structure, comprising:
   a substrate;
   a resistance layer disposed on the substrate;
   a protective layer overlying the resistance layer; and
   a first electrode structure being a piece of conductive material disposed at and being in electric contact with a first end of the resistance layer, and a second electrode structure being a piece of conductive material disposed at and being in electric contact with a second end opposite to the first end of the resistance layer, the first electrode structure comprising first and second conductive protrusions having a clearance from each other, and the second electrode structure comprising third and fourth conductive protrusions having a clearance from each other,
   wherein each of the first, second, third and fourth conductive protrusions has a top surface extending over that of the protective layer.

10. The resistor structure according to claim 9, wherein one of the conductive protrusions of the first electrode structure and one of the conductive protrusions of the second electrode structure serve as voltage-sensing terminals for electric connection to an external voltage measurement device, or serve as current-sensing terminals for electric connection to an external current measurement device.

11. The resistor structure according to claim 9, wherein each of the first conductive protrusion and the third conductive protrusion serves as a voltage-sensing terminal for electric connection to an external voltage measurement device, and each of the second conductive protrusion and the fourth conductive protrusion serves as a current-sensing terminal for electric connection to an external current measurement device.

12. The resistor structure according to claim 9, wherein respective topmost points of the first, second, third and fourth conductive protrusions are all coplanar.

13. The resistor structure according to claim 9, wherein a clearance between the first conductive protrusion of the first electrode structure and the third conductive protrusion of the second electrode structure is ranged between 450 μm and 570 μm, and a clearance between the second conductive protrusion of the first electrode structure and the fourth conductive protrusion of the second electrode structure is ranged between 450 μm and 570 μm.

14. The resistor structure according to claim 9 wherein the clearance between the first and second conductive protrusions of the first electrode structure is not less than 100 μm, and the clearance between the third and fourth conductive protrusions of the second electrode structure is not less than 100 μm.

15. The resistor structure according to claim 9, wherein at least one diameter of the first, second, third, and fourth conductive protrusions is ranged between 10 μm and 40 μm.

16. The resistor structure according to claim 9, wherein at least one thickness of the first, second, third, and fourth conductive protrusions is ranged between 10 µm and 50 µm.

17. The resistor structure according to claim 9, wherein each of the first, second, third, and fourth conductive protrusions includes a flat top surface.

18. A system for measuring a resistance of a resistor device, the resistor device including a resistor body, a first electrode structure in electric contact with a first end of the resistor body, and a second electrode structure in electric contact with a second end opposite to the first end of the resistor body, wherein each of the first electrode structure and the second electrode structure is a piece of conductive material and has a first set of conductive protrusion and a second set of conductive protrusion, the conductive protrusions of the first set are separated from each other, and the conductive protrusions of the second set are separated from each other, and the system comprising:

a fixture for measurement including four pads for electric contact with the first set of conductive protrusion and the second set of conductive protrusion of the first electrode structure and the first set of conductive protrusion and the second set of conductive protrusion of the second electrode structure, respectively, wherein each of the four pads has an area larger than an area of the first or second set of conductive protrusion in electric contact therewith;

a power device configured to provide a power;

a voltage measurement device electrically connected to the power device, the first set of conductive protrusion of the first electrode structure, and the first set of conductive protrusion of the second electrode structure, and configured to measure a voltage value between the first set of conductive protrusions of the first electrode structure and the second electrode structure under provision of the power;

a current measurement device electrically connected to the power device, the second set of conductive protrusion of the first electrode structure, and the second set of conductive protrusion of the second electrode structure, and configured to measure a current value passing through the second set of conductive protrusions of the first electrode structure and the second electrode structure under provision of the power; and a resistance-determining device electrically connected to the voltage measurement device and the current measurement device, and configured to obtain the resistance of the resistor device based on the voltage value and the current value.

19. The resistor structure according to claim 1, wherein the first electrode structure and the first and second conductive protrusions are formed of the same material.

20. The resistor structure according to claim 1, further comprising a plating layer formed on a top electrode and encapsulating lateral surfaces of the first, second, third and fourth conductive protrusions.

\* \* \* \* \*